United States Patent
Tsuzuki et al.

(10) Patent No.: US 9,243,951 B2
(45) Date of Patent: Jan. 26, 2016

(54) PHOTOELECTRIC SENSOR AND METHOD FOR CONTROLLING AMPLIFICATION OF RECEIVED LIGHT INTENSITY IN PHOTOELECTRIC SENSOR

(71) Applicant: OMRON CORPORATION, Kyoto (JP)

(72) Inventors: Ryosuke Tsuzuki, Ayabe (JP); Takehiro Kawai, Ayabe (JP); Motoharu Okuno, Shanghai (CN)

(73) Assignee: OMRON CORPORATION, Kyoto (JP)

( * ) Notice: Subject to any disclaimer, the term of this patent is extended or adjusted under 35 U.S.C. 154(b) by 179 days.

(21) Appl. No.: 13/930,025

(22) Filed: Jun. 28, 2013

(65) Prior Publication Data

US 2014/0001345 A1 Jan. 2, 2014

(30) Foreign Application Priority Data

Jun. 29, 2012 (JP) .................. 2012-147259

(51) Int. Cl.
*H03G 3/20* (2006.01)
*G01J 1/44* (2006.01)
*H03F 3/08* (2006.01)
*H03G 1/00* (2006.01)

(52) U.S. Cl.
CPC ... *G01J 1/44* (2013.01); *H03F 3/08* (2013.01); *H03G 1/00* (2013.01)

(58) Field of Classification Search
CPC .................................. H03G 1/00; H03G 7/06
USPC .................................. 250/214 AG
See application file for complete search history.

(56) References Cited

U.S. PATENT DOCUMENTS

2007/0262818 A1* 11/2007 Lee et al. .............. 330/278

FOREIGN PATENT DOCUMENTS

| CN | 101009479 A | 8/2007 |
|---|---|---|
| JP | 6-54322 U | 7/1994 |
| JP | 7-43007 U | 8/1995 |
| JP | 2008-170185 A | 7/2008 |

OTHER PUBLICATIONS

Chinese Office Action in CN Application No. 201310269840.3, with machine translation, dated Jun. 10, 2015.

* cited by examiner

*Primary Examiner* — Thanh Luu
(74) *Attorney, Agent, or Firm* — Greenblum & Bernstein, P.L.C.

(57) ABSTRACT

A photoelectric sensor amplifies a received light intensity signal generated through light projection processing and light receiving processing, and performs detection processing using the amplified received light intensity signal. The photoelectric sensor is provided with a variable resistor that generates an adjustment command signal that changes linearly with respect to sensitivity adjustment manipulations performed by a user. Further, the sensor is provided with an amplifier including a variable gain amplifier configured such that the aforementioned adjustment command signal is inputted thereto. Further, the variable gain amplifier is adapted to convert the signal into a gain control signal that changes exponentially with respect to sensitivity adjustment manipulations and, further, is adapted to perform amplification processing using a gain according to the gain control signal.

5 Claims, 6 Drawing Sheets

ADJUSTMENT COMMAND SIGNAL

GAIN CONTROL SIGNAL

PHOTOELECTRIC SENSOR AND METHOD FOR CONTROLLING AMPLIFICATION OF RECEIVED LIGHT INTENSITY IN PHOTOELECTRIC SENSOR

CROSS-REFERENCE TO RELATED APPLICATION

This application claims benefit of priority under 35 U.S.C. §119 to Japanese Patent Application No. 2012-147259 filed on Jun. 29, 2012, which is expressly incorporated herein by reference in its entirety.

1. FIELD OF THE DISCLOSURE

The present disclosure relates to a photoelectric sensor that projects light for detection, receives the light directly or light reflected from an object, and detects the object based on an amount of the received light. More particularly, the present disclosure relates to a photoelectric sensor having a function of variably setting an amplification gain of the received light intensity according to an adjustment manipulation performed by a user.

2. BACKGROUND INFORMATION

FIG. 4 illustrates an example of a conventional photoelectric sensor having the function of adjusting the amplification gain of the received light intensity. The photoelectric sensor in this example is a reflective-type sensor including a light projecting unit 2 including a light projecting element (LED) 20, and a photo IC chip IT including a light receiving element 10 (a photodiode), which are incorporated in a single casing. The photo IC chip 1T includes a light-projection control part (a light-projection controller) 11, an I/V converter part (an I/V converter) 12, a preamplifier 13, a main amplifier 15, a comparator part (a comparator) 16, a signal processing part (a signal processor) 17, an output part (an outputter) 18, and the like. Further, a variable resistor 100 and a capacitor 110 are externally attached to the photo IC chip 1T. In the figure, the I/V converter part 12, the preamplifier 13, the main amplifier 15, the variable resistor 100, and the capacitor 110 constitute an amplification processing part (amplification processor) for amplifying received light intensity signals, and the comparator part 16 and the signal processing part 17 constitute a detection processing part (detection processor) for performing detection processing using the amplified received light intensity signals.

The light-projection control part 11 is connected to the signal processing part 17 and is also connected to the light projecting unit 2 through a terminal T1. The output part 18 is connected to an output circuit (not illustrated), through a terminal T2. An output line from the preamplifier 13 is connected to a first fixed terminal a of the variable resistor 100 through a terminal T11, and an input line to the main amplifier 15 is connected to a first electrode of the capacitor 110 through a terminal T12. The variable resistor 100 has a second fixed terminal b which is grounded and has a movable terminal c which is connected to a second electrode of the capacitor 110.

The LED 20 of the light projecting unit 2 is caused to emit light, by receiving driving pulses supplied thereto from the signal processing part 17 through the light-projection control part 11. The photodiode 10 generates a received light intensity signal (a current signal) through photoelectric conversion. The received light intensity signal (the current signal) is converted into a voltage signal by the I/V converter part 12, and the voltage signal is amplified by the preamplifier 13. The output from the preamplifier 13 is subjected to a voltage division by the variable resistor 100 and a signal resulted from the voltage drop between the terminals c and b is inputted to the main amplifier 15 to be amplified.

The movable terminal c of the variable resistor 100 is moved between the terminals a and b, along with the rotation of a rotational part, which is not illustrated. Along with the change of the position thereof, the ratio between the resistance between the terminals a and c and the resistance between the terminals c and b is changed and, along therewith, the received light intensity signal is changed, in level, before it is inputted to the main amplifier.

The rotational part of the variable resistor 100 is rotated through rotating manipulations performed by a user. In this example of the conventional photoelectric sensor, within the range of the rotation of the rotational part, a tick mark of 0 is assigned to an end-edge position at which the movable terminal c is made closest to the fixed terminal b, and tick marks are assigned at even intervals, such that they have values gradually increasing, such as "1, 2, 3 . . . ", with decreasing distance to the other end. As the amount of the rotation of the rotational part with respect to the tick mark of 0 is increased, the movable terminal c gets farther away from the fixed terminal b, which increases the ratio of the resistance between the terminals c and b to the resistance between the terminals a and c. This resistance change results in a linear change in the displacement of the movable terminal c (which means a change substantially proportional to the distance between the terminals c and b). The level of the signal inputted to the main amplifier 15 exhibits a similar change.

The preamplifier 13 and the main amplifier 15 are set to have constant gains and, therefore, the ratio Vout/Vin of the level Vout of the signal outputted from the main amplifier to the level Vin of the signal inputted to the preamplifier 13 (the gain of the entire amplification processing part) is also changed linearly with respect to the movement of the movable terminal c.

However, when the gain of the received light intensity changes linearly with respect to the displacement of the movable terminal c, the gain change rate while the movable terminal c is moved is varied depending on the position of the terminal c during the movement. For example, FIG. 5 illustrates a graph representing the relationship between the gain of the received light intensity and the position of the movable terminal c, which is indicated by respective tick marks, wherein a straight line A indicates an example of a linear change, assuming that the range of the rotation of the rotational part is evenly divided by tick marks of 0 to 10.

The straight line A is normalized such that the maximum value of Vout/Vin is 1.0, and the gain changes in steps of 0.1 with respect to the movement of the movable terminal c by an amount corresponding to a single tick mark. Accordingly, if the movable terminal c is moved from the position corresponding to the maximum tick mark of 10 to the position corresponding to the tick mark smaller there than by a single step, namely the tick mark of 9, the gain changes from 1.0 to 0.9, wherein the ratio of the gain after being changed to the gain before being changed is −10%. On the other hand, if the movable terminal c is moved from the position corresponding to the tick mark of 2 to the position corresponding to the tick mark of 1, the gain changes from 0.2 to 0.1, wherein the ratio of the gain after being changed to the gain before being changed is −50%.

The received light intensity in the photoelectric sensor increases with decreasing detection distance. When the detection distance is shorter, and the received light intensity is made larger, it is necessary that the amount of movement of the movable terminal c with respect to the fixed terminal b be made smaller (namely, it is necessary that the rotational part be set to a tick mark, within a range in which there are tick marks having smaller values), in order to make the gain smaller, while it is necessary to finely adjust the gain in order to ensure high detection accuracy. However, regarding the relationship represented by the straight line A in FIG. 5, if the rotational part is set to a tick mark within the range in which there are tick marks having smaller values, in order to make the gain smaller, the gain is largely changed even by a smaller amount of movement of the rotational part, which makes it hard to finely adjust the sensitivity.

As a method for overcoming the problem, there has been suggested connecting a correction resistor 200 in parallel to the variable resistor 100 for bringing the gain change with respect to the movement of the movable terminal c close to an exponential change, as illustrated in FIG. 6 (refer to Japanese Utility Model (Registration) Application Laid-Open Publication No. 6-54322, and Japanese Utility Model (Registration) Application Laid-Open Publication No. 7-43007).

A curve B in FIG. 5 represents an example of a case where the gain changes exponentially with respect to the movement of the movable terminal c. Regarding the relationship represented by the curve, regardless of the position from which the movable terminal c is moved, the movement thereof by an amount corresponding to a single tick mark causes a gain change at a rate of about 50% of the gain value before the movement. This enables the user to adjust the gain, with the recognition that the gain is doubled by increasing the amount of the rotation of the rotational part by an amount corresponding to a single tick mark, and the gain is halved by decreasing the amount of the rotation thereof by an amount corresponding to a single tick mark. This allows the user to easily recognize the degree of the adjustment. Furthermore, the gain can be made to have a smaller value, while the rotational part is set to a tick mark within the range in which there are tick marks having smaller values. This makes it easier to finely adjust the gain, when the detection distance is shorter and, thus, the received light intensity is larger.

With the circuit having the structure including the correction resistor 200 illustrated in FIG. 6, it is possible to realize gain changes closer to exponential changes, but it is impossible to provide a completely-exponential characteristic. Under conditions where smaller amounts of manipulations are performed through sensitivity adjustment manipulations, the gain still has a relatively-higher value and, also, the gain change rate with respect to manipulations cannot be made constant. Therefore, the structure is insufficient to overcome the inconvenience in gain adjustments.

SUMMARY

In focusing attention to the aforementioned problems, the present disclosure aims at enabling changing the gain at a stable rate with respect to sensitivity adjustment manipulations, regardless of the set value of the gain during such sensitivity adjustment manipulations, in order to enable adjustments thereof in conformance with senses of the user who performs the sensitivity adjustments.

In accordance with one aspect of the present disclosure, the present disclosure is applied to a photoelectric sensor having an amplification processing part (an amplifier) that amplifies a received light intensity signal generated through light projection processing and light receiving processing, and a detection processing part (a detector) that performs detection processing using the amplified received light intensity signal. The way of the detection may be either a reflective type or a transmissive type.

The amplification processing part of the photoelectric sensor of the present disclosure includes a gain control part (a gain controller) that receives an adjustment command signal changing linearly with respect to a sensitivity adjustment manipulation performed by a user and converts the adjustment command signal into a gain control signal changing exponentially with respect to the sensitivity adjustment manipulation. Further, the amplification processing part includes a variable amplification part (a variable amplifier) that performs amplification processing using a gain according to the gain control signal.

Further, "linear changes" and "exponential changes" with respect to sensitivity adjustment manipulations may involve some degrees of errors.

In the aforementioned description, through sensitivity adjustment manipulations, it is possible to specify as to whether the gain of the received light intensity should be increased from the current value or decreased from the current value and, further, it is possible to specify the amount of the increase or decrease. For example, when sensitivity adjustment manipulations are performed through a method for moving a rotational part of a variable resistor, the aforementioned specification can be performed with the direction of the rotation of the rotational part and with the angle of the rotation thereof.

With the photoelectric sensor having the structure, it is possible to change the gain of the received light intensity exponentially with respect to sensitivity adjustment manipulations, which enables increasing and decreasing the gain at a stable rate at the start of manipulations, regardless of the value of the gain and the received light intensity during manipulations. This enables the user to easily determine the degrees of manipulations required for adjusting the received light intensity to desired levels, thereby enabling the user to easily perform adjustments. Further, it is possible to facilitate fine adjustments of the gain, in cases where the detection distance is shorter and, thus, the gain is made smaller.

In one embodiment, the photoelectric sensor is further provided with a variable resistor having a pair of fixed terminals and a movable terminal moving between the fixed terminals, according to the sensitivity adjustment manipulation. A constant voltage (reference voltage) is applied between the fixed terminals of the variable resistor, and a signal formed from a voltage (voltage drop) resulting from a voltage division based on the position of the movable terminal between the fixed terminals is inputted, as the adjustment command signal, to the gain control part. Since the constant voltage is applied to the variable resistor as described above, it is possible to produce an adjustment command signal changing linearly with respect to the displacement of the movable terminal.

In the embodiment, the amplification processing part and the detection processing part may be incorporated in a single integrated circuit (IC) chip and, in this case, it is desirable to provide a low-pass filter in the path connecting between the movable terminal of the variable resistor and the gain control part. The circuits within the IC chip are protected from noises due to the shielding function of the chip main body, but the adjustment command signal is generated by the variable resistor outside the IC chip and, therefore, may contain various noise components superimposed therein. Therefore, if the adjustment command signal containing such noises is inputted to the gain control part, this may cause it to produce an erroneous gain control signal, which may induce amplification which does not reflect sensitivity adjustment manipulations. If the adjustment command signal containing no noise component is inputted thereto through the low-pass filter, it is possible to ensure high accuracy of the gain control signal, which enables amplification processing which faithfully conform to sensitivity adjustment manipulations.

Further, the IC chip may be a photo IC chip incorporating a light receiving element.

In accordance with another aspect of the present disclosure, there is provided a control method for controlling processing to amplify a received light intensity in a photoelectric sensor that includes an amplification processing part (an amplifier) having incorporated therein a variable amplification part (a variable amplifier) and amplifying a received light intensity signal generated through light projection processing and light receiving processing, and detection processing part (a detector) performing detection processing using the amplified received light intensity signal. The method includes generating an adjustment command signal changing linearly with respect to a sensitivity adjustment manipulation performed by a user, converting the adjustment command signal into a gain control signal changing exponentially with respect to the sensitivity adjustment manipulation, and supplying the gain control signal to the variable amplification part to perform amplification processing using a gain according to the signal.

In the method, generating the adjustment command signal may be also performed outside the casing of the photoelectric sensor rather than inside the casing of the photoelectric sensor, and the generated adjustment command signal may be inputted to the photoelectric sensor.

According to the present disclosure, regardless of the value of the gain and the received light intensity at the time of the start of sensitivity adjustment manipulations, it is possible to change the gain at a substantially-constant rate with respect to sensitivity adjustment manipulations, which enables the user to easily determine the degrees of manipulations required for adjusting the received light intensity to desired levels.

Further, it is possible to facilitate fine adjustments of the gain in cases where the detection distance is shorter and the received light intensity is larger. This can improve the detection accuracy.

DETAILED DESCRIPTION

Figure 1:
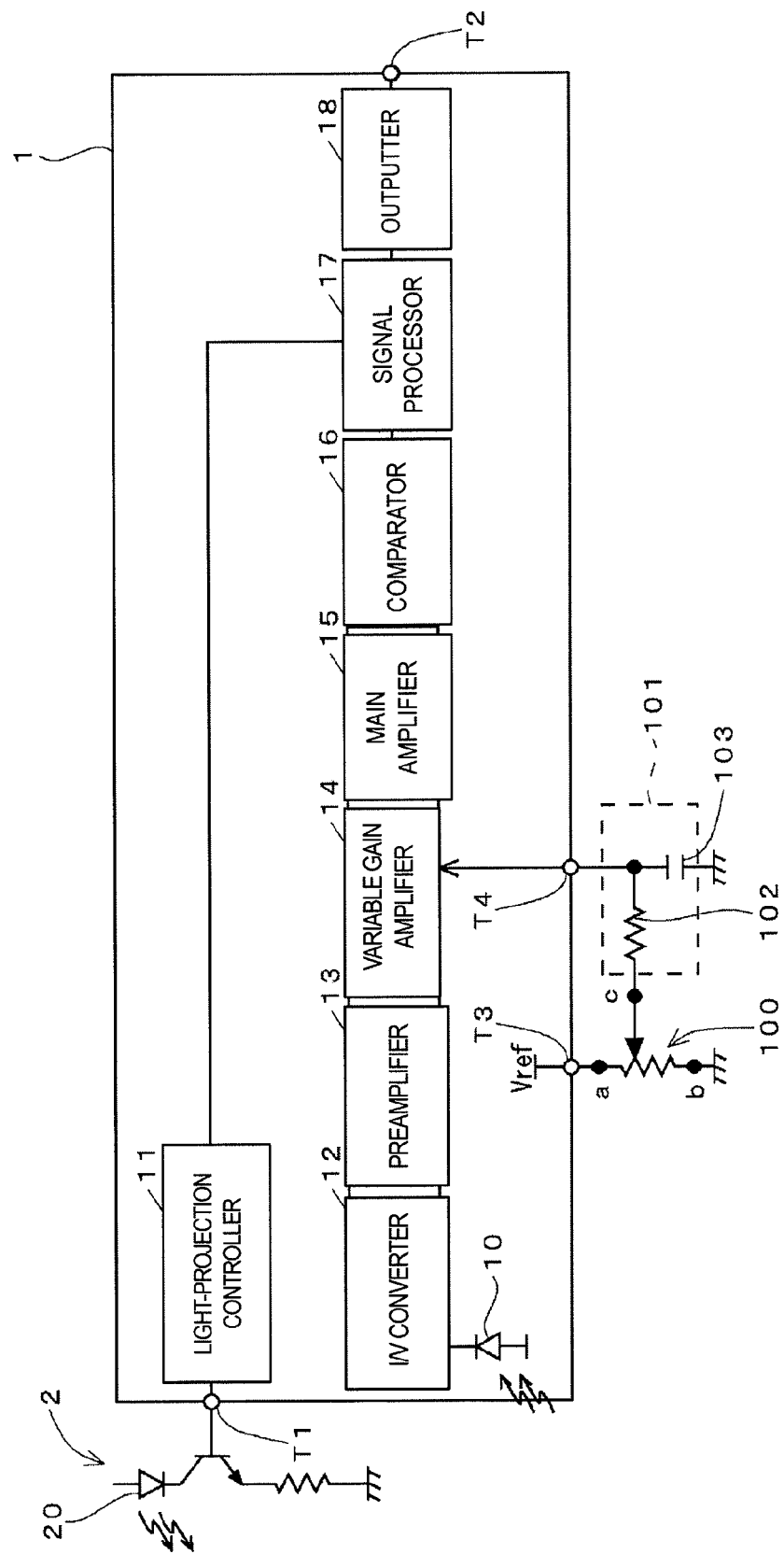
FIG. 1 is a block diagram illustrating an example of the structure of a reflective-type photoelectric sensor to which the present disclosure is applied.
Figure 4:
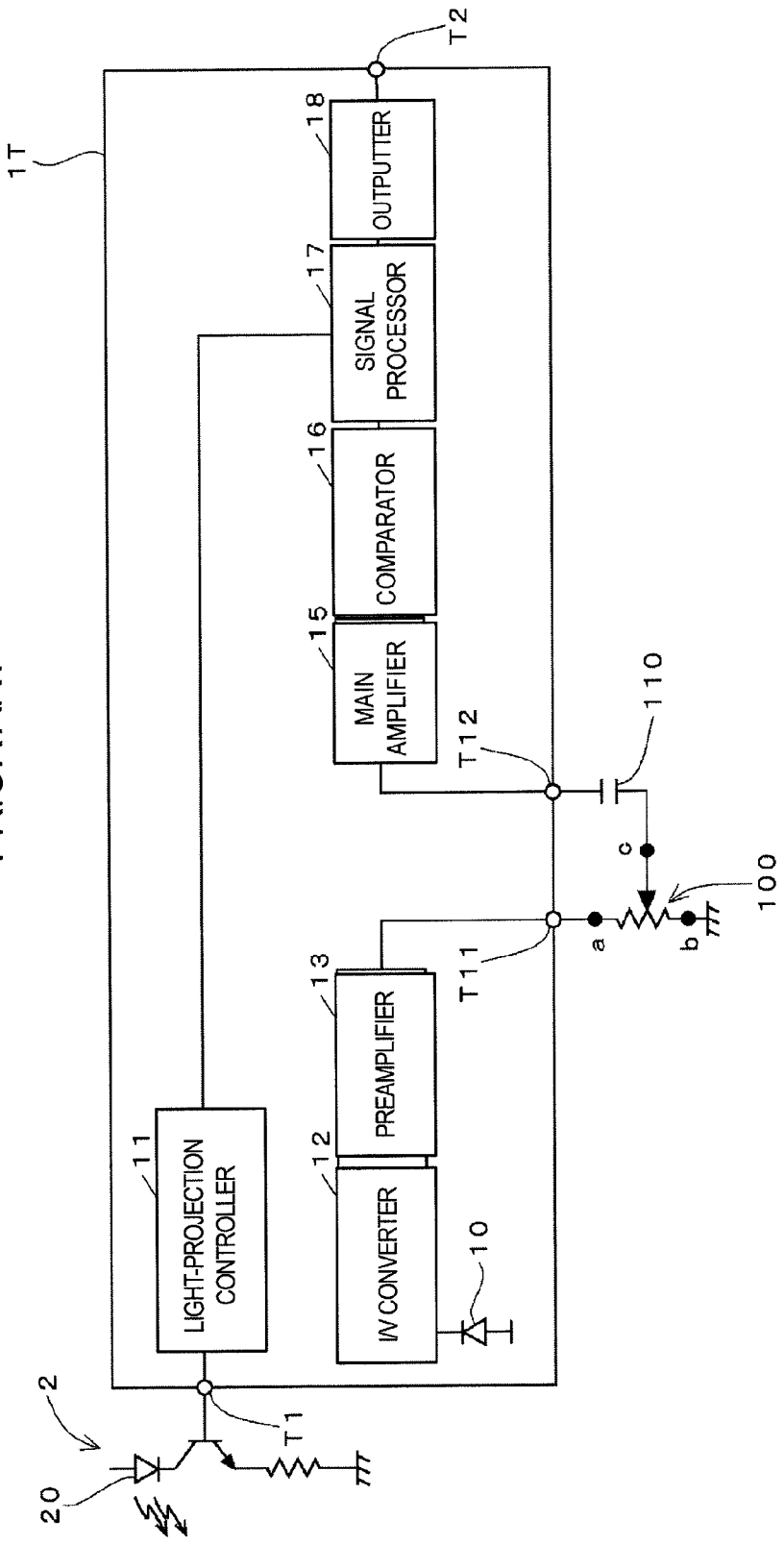
FIG. 4 is a block diagram illustrating an example of the structure of a conventional photoelectric sensor.
Figure 5:
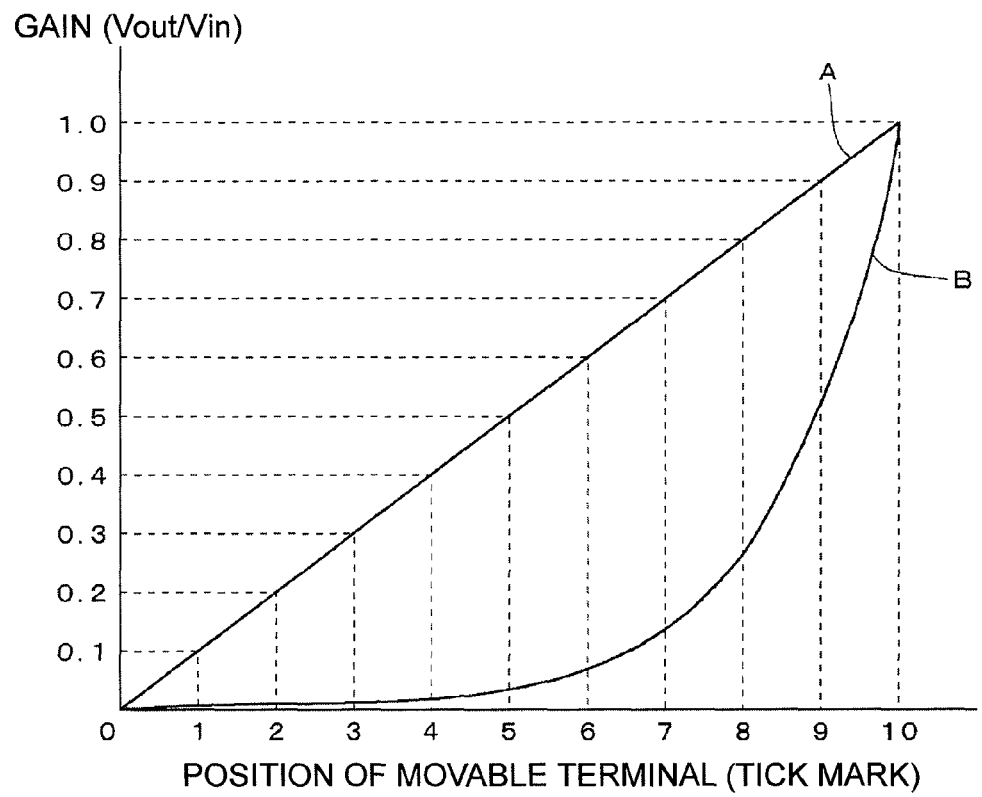
FIG. 5 is a graph representing an example of a linear change of the gain of the received light intensity, and an example of an exponential change of the gain of the received light intensity, with respect to the change of the position of the movable terminal of the variable resistor.
Figure 6:
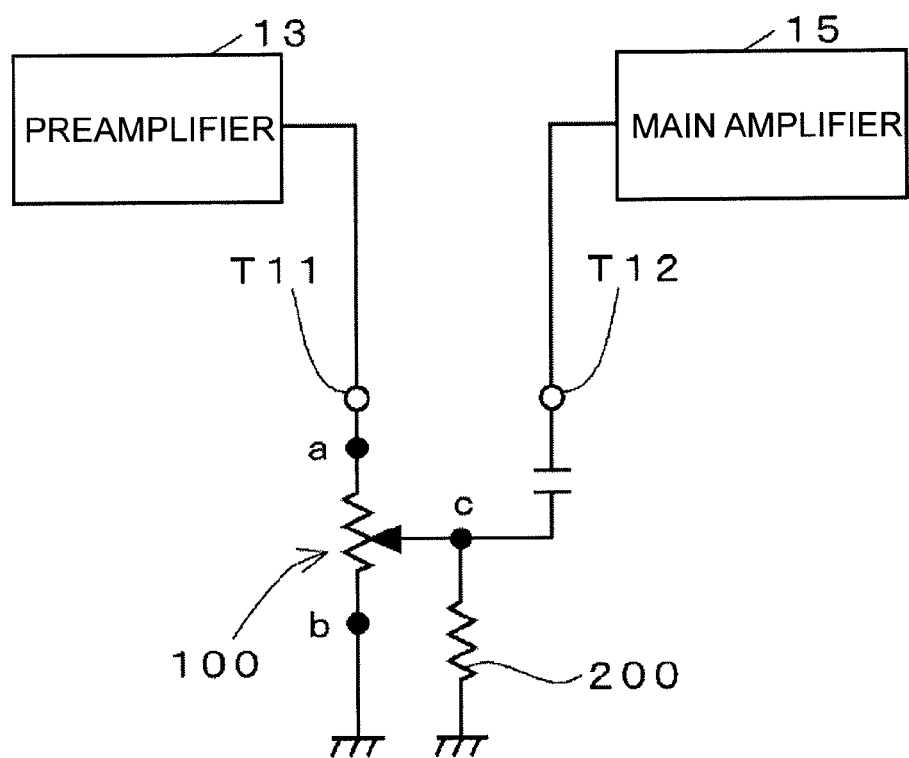
FIG. 6 is a circuit diagram illustrating an example where a correction resistor is connected to the variable resistor.

FIG. 1 illustrates an example of the structure of a reflective-type photoelectric sensor to which the present disclosure is applied. Further, in FIG. 1, structures corresponding to those in the example of a conventional photoelectric sensor illustrated in FIG. 4 are designated by the same reference characters as those in FIG. 4.

The photoelectric sensor in the present embodiment has a casing which incorporates a light projecting unit 2 including an LED 20, and a photo IC chip 1 including a photodiode 10.

The photo IC chip 1 is provided with a light-projection control part (a light-projection controller) 11, an I/V converter part (an I/V converter) 12, a preamplifier 13, a variable gain amplifier 14, a main amplifier 15, a comparator part (a comparator) 16, a signal processing part (a signal processor) 17, and an output part (an outputter) 18, in addition to the photodiode 10. The light-projection control part 11 is connected to the signal processing part 17 and is also connected to the light projecting unit 20 through a terminal T1. The output part 18 is connected to an output circuit (not illustrated) which exists outside the IC chip, through a terminal T2.

The I/V converter part 12, the preamplifier 13, the variable gain amplifier 14 and the main amplifier 15 constitute an amplification processing part (processor), in cooperation with a variable resistor 100 and a low-pass filter 101 which will be described later. Further, the comparator part 16 and the signal processing part 17 constitute a detection processing part (processor).

The LED 20 of the light projecting unit 2 is caused to emit light, through driving pulses supplied thereto from the signal processing part 17 through the light-projection control part 11. The photodiode 10 generates a received light intensity signal (a current signal) through photoelectric conversion. The received light intensity signal (the current signal) is converted into a voltage signal by the I/V converter part 12, and the voltage signal is subjected to amplification processing by the preamplifier 13, the variable gain amplifier 14 and the main amplifier 15. The comparator part 16 compares the amplified received light intensity signal, with a reference voltage. The signal processing part 17 generates a signal indicative of the presence of an object, based on the signal from the comparator part 16. The signal is outputted, as a detection signal, from the output part 18.

The photo IC chip 1 is provided with a terminal T3 for connecting the variable resistor 100 thereto and, further, is provided with a terminal T4 for receiving an adjustment command signal generated by the variable resistor 100. Inside the photo IC chip 1, the terminal T3 is connected to a predetermined voltage Vref, and the terminal T4 is connected to the variable gain amplifier 14.

Outside the photo IC chip 1, a first fixed terminal a of the variable resistor 100 is connected to the terminal T3, and the low-pass filter 101 (which is constituted by a resistor 102 and a capacitor 103) is connected to the terminal T4. A second fixed terminal b of the variable resistor 100 is grounded, and a movable terminal c is connected to an input terminal of the low-pass filter 101.

Through the aforementioned connections, the voltage Vref is applied between the fixed terminals a and b of the variable resistor 100, the voltage Vref is subjected to a voltage division according to the ratio between the resistance between the terminals a and c and the resistance between the terminals c and b of the variable resistor 100, and a signal resulting from the voltage drop between the terminals c and b is inputted to the variable gain amplifier 14 through the low-pass filter 101. The signal functions as the adjustment command signal which has been previously described. The movable terminal c is moved between the terminals a and b, along with the rotation of a rotational part, which is not illustrated, of the variable resistor 100. Due to the change of the voltage-division ratio caused by the movement, the adjustment command signal changes linearly with respect to the displacement of the movable terminal c, as illustrated in FIG. 2A.

Figure 2A:
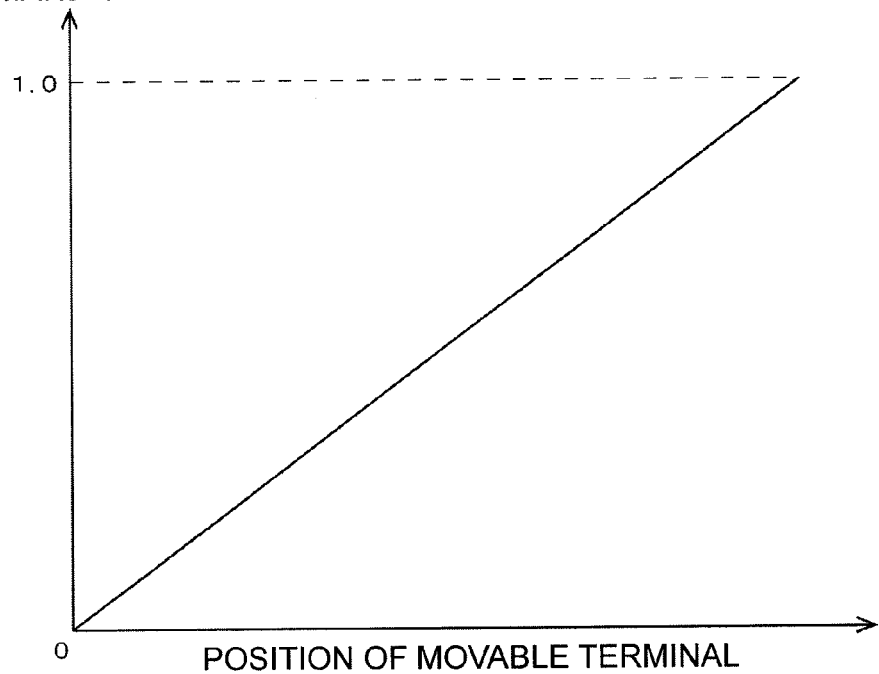
FIG. 2A is a graph representing characteristics of changes of an adjustment command signal with respect to the change of the position of a movable terminal of a variable resistor.

Further, in the graph in FIG. 2A, the horizontal axis represents the distance between the movable terminal c and the fixed terminal b, such that it gradually increases with increasing distance from the left side toward the right side thereof, when viewed from the person facing toward the paper plane. Further, the vertical axis is normalized, such that the adjustment command signal (with a maximum value) has a value of 1.0, when the distance between the terminals c and b is maximized.

Figure 2B:
FIG. 2B is a graph representing characteristics of changes of a gain control signal with respect to the change of the position of a movable terminal of a variable resistor.
Figure 2B:
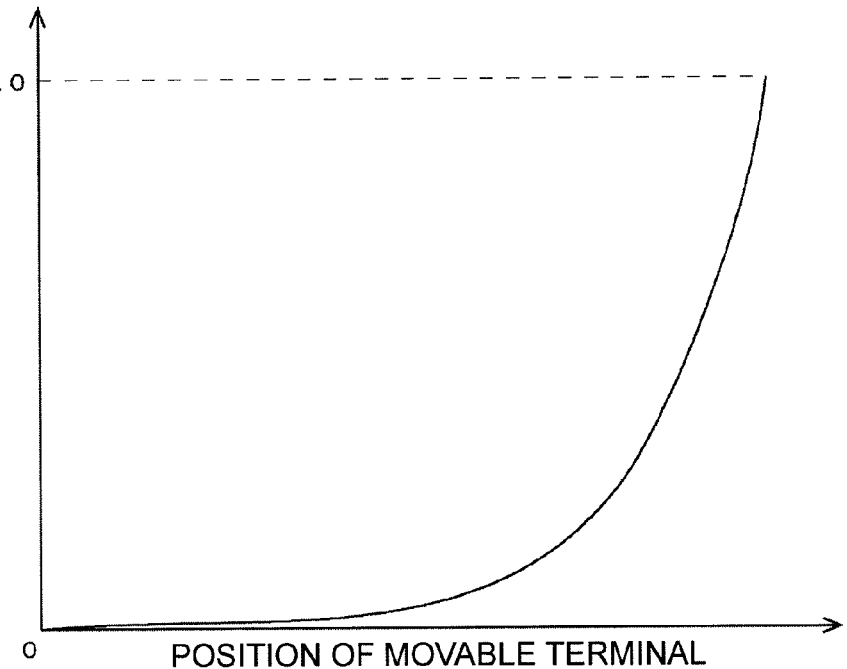
Figure 3:
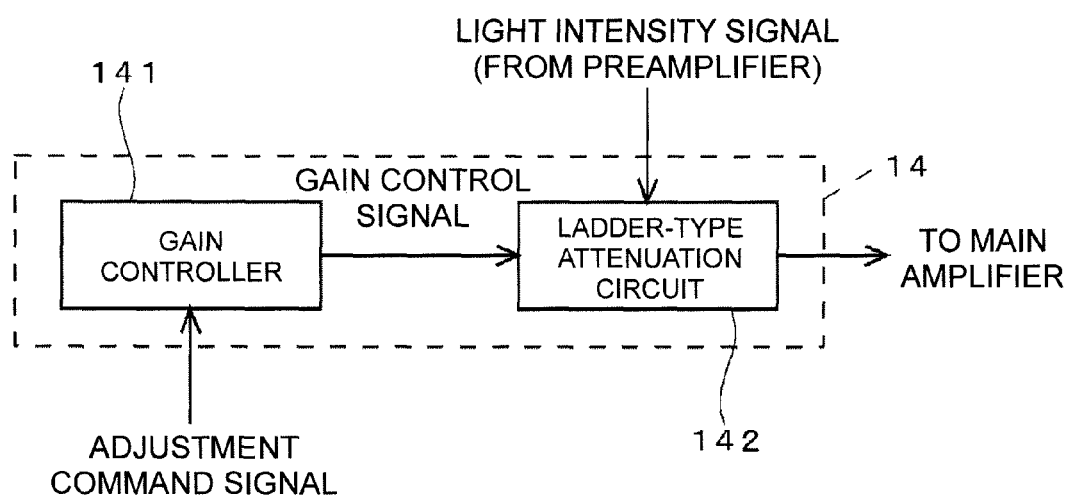
FIG. 3 is a block diagram schematically illustrating the structure of a variable gain amplifier.

As illustrated in FIG. 3, the variable gain amplifier 14 includes a gain control part (a gain controller) 141, and a ladder-type attenuation circuit 142. The gain control part 141 converts the adjustment command signal generated by the variable resistor 100 into a signal changing exponentially as illustrated in FIG. 2B (which is normalized such that its maximum value is 1.0). The signal resulted from the conversion is inputted, as a gain control signal, to the ladder-type attenuation circuit 142.

The ladder-type attenuation circuit 142 includes a plurality of differential amplifiers, a series circuit which is constituted by ladder resistors such that the number of the ladder resistors corresponds to that of the respective differential amplifiers, an interpolator, an integrator, and the like. The respective differential amplifiers are supplied with received light intensity signals having been attenuated at different rates from the series circuit constituted by the ladder resistors. The outputs from the respective differential amplifiers are weighted through weighting signals from the interpolator, and the weighted signals are integrated by the integrator and, further, the integrated signals are outputted to the main amplifier.

The interpolator changes the distribution of the intensities of the weighting signals for the respective differential amplifiers, according to the gain control signal, in order to vary the attenuation rate of the entire ladder-type attenuation circuit 142. The attenuation rate is designed such that it changes exponentially with respect to the change according to the gain control signal, namely with respect to the displacement of the movable terminal c of the variable resistor 100.

The preamplifier 13 and the main amplifier 15 have constant gains and, therefore, the ratio Vout/Vin of the level Vout of the output from the main amplifier 15 to the level Vin of the input to the preamplifier 13 (the gain which is set in the entire light-receiving processing part) is similarly changed exponentially with respect to the displacement of the movable terminal c. Accordingly, regardless of the position of the movable terminal c during sensitivity adjustment manipulations, it is possible to change the gain at a substantially-constant rate, along with the movement of the movable terminal c.

In the aforementioned structure, the internal circuit of the photo IC chip is protected by the shield of the chip main body. However, the variable resistor 100, and the signal lines from the movable terminal c to the terminal T4 exist outside the photo IC chip 1, which may induce high-frequency noises superimposed on the adjustment command signal, which is a DC signal. If an adjustment command signal containing noises superimposed thereon is inputted to the gain control part 141, this may cause it to produce an erroneous gain control signal, which may induce erroneous operations in the ladder-type attenuation circuit 142. However, in the present embodiment, the low-pass filter 101 is provided in the input path for the adjustment command signal, which can eliminate noises superimposed on the adjustment command signal outside the photo IC chip, thereby allowing only the DC component to be inputted to the gain control part 141. This enables gain adjustments which are faithfully in conformance with sensitivity adjustment manipulations performed by the user. Further, the position of the low-pass filter 101 is not limited to the outside of the photo IC chip 1. That is, the movable terminal c of the variable resistor 100 may be connected to the terminal T4 of the photo IC chip 1, and a low-pass filter may be placed in the path between the variable gain amplifier 14 and the terminal T4 of the photo IC chip 1.

Further, in the aforementioned embodiment, the photoelectric sensor is of a reflective-type. However, in a transmissive-type photoelectric sensor, similarly, a photo IC similar to that in the aforementioned embodiment can be incorporated in a light receiving unit therein, together with a variable resistor 100 and a low-pass filter 110 which are externally attached thereto.

Further, in the aforementioned embodiment, the predetermined voltage Vref is applied between the fixed terminals a and b of the variable resistor 100, and the adjustment command signal is generated with the voltage resulted from the voltage division based on the position of the movable terminal c. However, the structure for generating an adjustment command signal is not limited to a variable resistor. Further, the contents of sensitivity adjustment manipulations are not limited to rotational manipulations.

For example, the casing of the photoelectric sensor can be provided with an UP key for generating a command for increasing the gain, and a Down key for generating a command for decreasing the gain, and a signal can be generated such that the signal increases by a certain level every time the UP key has been manipulated and the signal decreases by a certain level every time the Down key has been manipulated, such that the signal functions as an adjustment command signal.

Also, the photoelectric sensor may be connected to a setting apparatus such as a console, such that sensitivity adjustment manipulations can be performed through the setting apparatus, an adjustment command signal changing linearly according to these manipulations can be transmitted to the photoelectric sensor, the adjustment command signal can be converted into a gain control signal which exponentially changes, and the amplification gain in the photoelectric sensor can be controlled through the signal. Further, such sensitivity adjustment manipulations through the setting apparatus are not limited to analog manipulations and can be also manipulations for specifying a gain change rate through numerical values, such as "twice (the current value)", for example.

What is claimed is:

1. A photoelectric sensor comprising:
an amplifier that amplifies a received light intensity signal generated through light projection processing and light receiving processing;
a detector that performs detection processing using the amplified received light intensity signal;
a variable resistor having a pair of fixed terminals and a movable terminal configured to move between the fixed terminals, according to a sensitivity adjustment manipulation performed by a user,
wherein the amplifier includes:
a gain controller that receives an adjustment command signal that changes linearly with respect to the sensitivity adjustment manipulation performed by the user, and converts the adjustment command signal into a gain control signal that changes exponentially with respect to the sensitivity adjustment manipulation; and a variable amplifier that performs amplification processing using a gain according to the gain control signal, wherein a reference voltage is applied between the fixed terminals of the variable resistor, and a signal formed from a voltage drop resulting from a voltage division based on the position of the movable terminal between the fixed terminals is inputted, as the adjustment command signal, to the gain controller.

2. The photoelectric sensor according to claim 1, wherein the amplifier and the detector are included in an integrated circuit (IC) chip, and a low-pass filter is provided in a path between the movable terminal of the variable resistor and the gain controller.

3. The photoelectric sensor according to claim 1, wherein the signal from the voltage drop is input to the variable amplifier through a low pass filter configured to eliminate noise associated with the adjustment command signal.

4. A method for controlling processing to amplify a received light intensity in a photoelectric sensor that includes an amplifier having a variable amplifier and amplifying a received light intensity signal generated through light projection processing and light receiving processing, and a detector that performs detection processing using the amplified received light intensity signal, the method comprising:

generating an adjustment command signal that changes linearly with respect to a sensitivity adjustment manipulation performed by a user;

converting the adjustment command signal into a gain control signal that changes exponentially with respect to the sensitivity adjustment manipulation; and supplying the gain control signal to the variable amplifier to perform amplification processing using a gain according to the gain control signal, wherein a movable terminal of a variable resistor is configured to move between a pair of fixed terminals of the variable resistor, according to the sensitivity adjustment manipulation, and wherein a reference voltage is applied between the fixed terminals of the variable resistor, and a signal formed from a voltage drop resulting from a voltage division based on the position of the movable terminal between the fixed terminals is inputted, as the adjustment command signal, to the gain controller.

5. A photoelectric sensor comprising:

an amplifier that amplifies a received light intensity signal generated through light projection processing and light receiving processing; and a detector that performs detection processing using the amplified received light intensity signal, wherein the amplifier includes:

a gain controller that receives an adjustment command signal that changes linearly with respect to a sensitivity adjustment manipulation performed by a user, and converts the adjustment command signal into a gain control signal that changes exponentially with respect to the sensitivity adjustment manipulation; and a variable amplifier that performs amplification processing using a gain according to the gain control signal, wherein the adjustment command signal changes linearly with respect to a displacement of a movable terminal.

* * * * *